US006614300B2

United States Patent
Mages

(10) Patent No.: US 6,614,300 B2
(45) Date of Patent: Sep. 2, 2003

(54) DUAL CURRENT MIRROR POWER AMPLIFIER BIAS CONTROL

(75) Inventor: Phillip J. Mages, San Diego, CA (US)

(73) Assignee: Nokia Corporation, Espoo (FI)

( * ) Notice: Subject to any disclaimer, the term of this patent is extended or adjusted under 35 U.S.C. 154(b) by 19 days.

(21) Appl. No.: 09/939,099

(22) Filed: Aug. 27, 2001

(65) Prior Publication Data

US 2003/0038676 A1 Feb. 27, 2003

(51) Int. Cl.[7] .................................................. H03G 5/16
(52) U.S. Cl. ....................... 330/133; 330/134; 330/254; 330/285
(58) Field of Search ................................. 330/133, 134, 330/285, 254

(56) References Cited

U.S. PATENT DOCUMENTS

| | | | | |
|---|---|---|---|---|
| 3,919,654 A | * | 11/1975 | Toumani | 330/254 |
| 4,987,380 A | * | 1/1991 | Ishikawa | 330/254 |
| 5,614,860 A | * | 3/1997 | Osaki et al. | 327/552 |
| 5,670,912 A | * | 9/1997 | Zocher | 330/296 |
| 6,163,215 A | * | 12/2000 | Shibata et al. | 330/254 |
| 6,178,313 B1 | | 1/2001 | Mages et al. | |
| 6,194,959 B1 | * | 2/2001 | Kamoshida et al. | 327/552 |
| 6,339,361 B1 | * | 1/2002 | Khesbak et al. | 330/285 |
| 6,353,298 B1 | * | 3/2002 | Jeffrey | 318/293 |

* cited by examiner

Primary Examiner—Michael Tokar
Assistant Examiner—Linh V Nguyen
(74) Attorney, Agent, or Firm—Harrington & Smith, LLP

(57) ABSTRACT

A mobile station (10) is constructed to include transmitter circuitry (20) and an antenna (24) for transmitting a signal. The transmitter circuitry includes a multistage power amplifier (1) having a first power amplifier stage (1A) with an output coupled to an input of a second power amplifier stage (1B). The output of the second power amplifier stage is coupled to the antenna. The transmitter circuitry further includes a source of variable bias current (3) that is input to the second power amplifier stage for controlling the gain thereof, a source of fixed bias current (3C), and a summing junction (3E) for summing the fixed bias current and the variable bias current for input to the first power amplifier stage for controlling the gain thereof. The gain of the first power amplifier stage is controlled such that a minimum desired gain of the second power amplifier stage is achieved without inducing a collapse in the gain of the first power amplifier stage. The transmitter circuitry may further include a circuit block (3D) coupled in series with the source of fixed bias current for selectively turning off the fixed bias current.

9 Claims, 3 Drawing Sheets

DUAL CURRENT MIRROR POWER AMPLIFIER BIAS CONTROL

TECHNICAL FIELD

These teachings relate generally to signal amplifiers and, more specifically, relate to variable gain, multi-stage power amplifier bias control circuits and methods, such as those employed in battery powered devices including mobile stations and cellular telephones.

BACKGROUND

FIG. 1 is a circuit diagram of a dual stage variable gain power amplifier 1 of a type that may be used in a mobile station. The power amplifier 1 is a dual stage device and includes a first stage power amplifier 1A that outputs an amplified signal to a second stage power amplifier 1B. The output of the second stage power amplifier 1B may be connected via suitable coupling circuitry to an antenna (not shown), and is used for transmitting an amplified RF signal over a reverse or return link to a base station or base site for reception and signal processing. The gain of the power amplifier 1 is controlled by the level of a bias control current signal 2 that is input to a current mirror 3 constructed of a first stage current mirror 3A and a second stage current mirror 3B. The current mirror 3 outputs a variable current to a bias current input of each of the power amplifiers 1A and 1B, thereby controlling the gain of each of the power amplifiers in tandem.

A problem that exits in the circuit depicted in FIG. 1 is that the gain collapses at low levels of the bias current (e.g., at a level less than about 40 mA). The gain collapse occurs because of the asymmetry of the power amplifiers 1A and 1B, i.e., the second stage power amplifier 1B is normally sized to be significantly larger than the first stage power amplifier 1A (e.g., a twenty times difference in integrated circuit die area may exist between amplifiers 1A and 1B), and also consumes significantly more current that the first stage power amplifier 1A (e.g., about 80% more current). However, the current mirror 3 is typically symmetrical, and thus provides an equal amount of bias current to each of the amplifiers 1A and 1B. As a result, the current mirror 3 does not correctly proportion the bias current to the first stage power amplifier 1A and to the second stage power amplifier 1B to achieve the lowest possible bias current setting. The end result is that the first power amplifier stage 1A can become starved of bias current before the second power amplifier stage 1B reaches its minimum possible bias current level. Such a collapse in gain of the first stage power amplifier 1A is undesirable, as it can adversely affect the ability of the mobile station to transmit a signal to the base station at low levels of transmitter gain. For example, the collapse in gain of the first stage power amplifier 1A can be manifested as a significant reduction in the input impedance of the amplifier 1A, thus disturbing the circuitry feeding the first stage amplifier.

While it may appear at first glance that one could construct the current mirror 3 in an asymmetrical fashion so that more current was delivered to the first stage power amplifier 1A, in practice this has proved difficult to achieve, and undesirable complexities arise in the design of the integrated circuit that contains the power amplifier 1 and the current mirror 3.

SUMMARY

The foregoing and other problems are overcome by methods and apparatus in accordance with embodiments of these teachings.

A method is disclosed for operating a plurality of serially coupled power amplifiers. The method includes controlling the gain of a highest powered power amplifier with a variable bias current $I_{variable}$; and simultaneously controlling the gain of a lower powered power amplifier that feeds the highest powered power amplifier with a bias current having a value equal to $I_{variable}+I_{fixed}$, where $I_{fixed}<I_{variable}$.

A mobile station is constructed to include transmitter circuitry and an antenna for transmitting a signal, where the transmitter circuitry includes a multi-stage power amplifier having a first power amplifier stage with an output coupled to an input of a second power amplifier stage. The output of the second power amplifier stage is coupled to the antenna. The transmitter circuitry further includes a source of variable bias current that is input to the second power amplifier stage for controlling the gain thereof, a source of fixed bias current, and a summing junction for summing the fixed bias current and the variable bias current for input to the first power amplifier stage for controlling the gain thereof. The gain of the first power amplifier stage is controlled such that a minimum desired gain of the second power amplifier stage is achieved without inducing a collapse in the gain of the first power amplifier stage.

The transmitter circuitry may further include a circuit block coupled in series with the source of fixed bias current for selectively turning off the fixed bias current.

The source of variable bias current is coupled to a bias control current signal generated by a data processor that is responsive to required changes in transmitter output power.

BRIEF DESCRIPTION OF THE DRAWINGS

The above set forth and other features of these teachings are made more apparent in the ensuing Detailed Description of the Preferred Embodiments when read in conjunction with the attached Drawings, wherein.

DETAILED DESCRIPTION OF THE PREFERRED EMBODIMENTS

Figure 2:
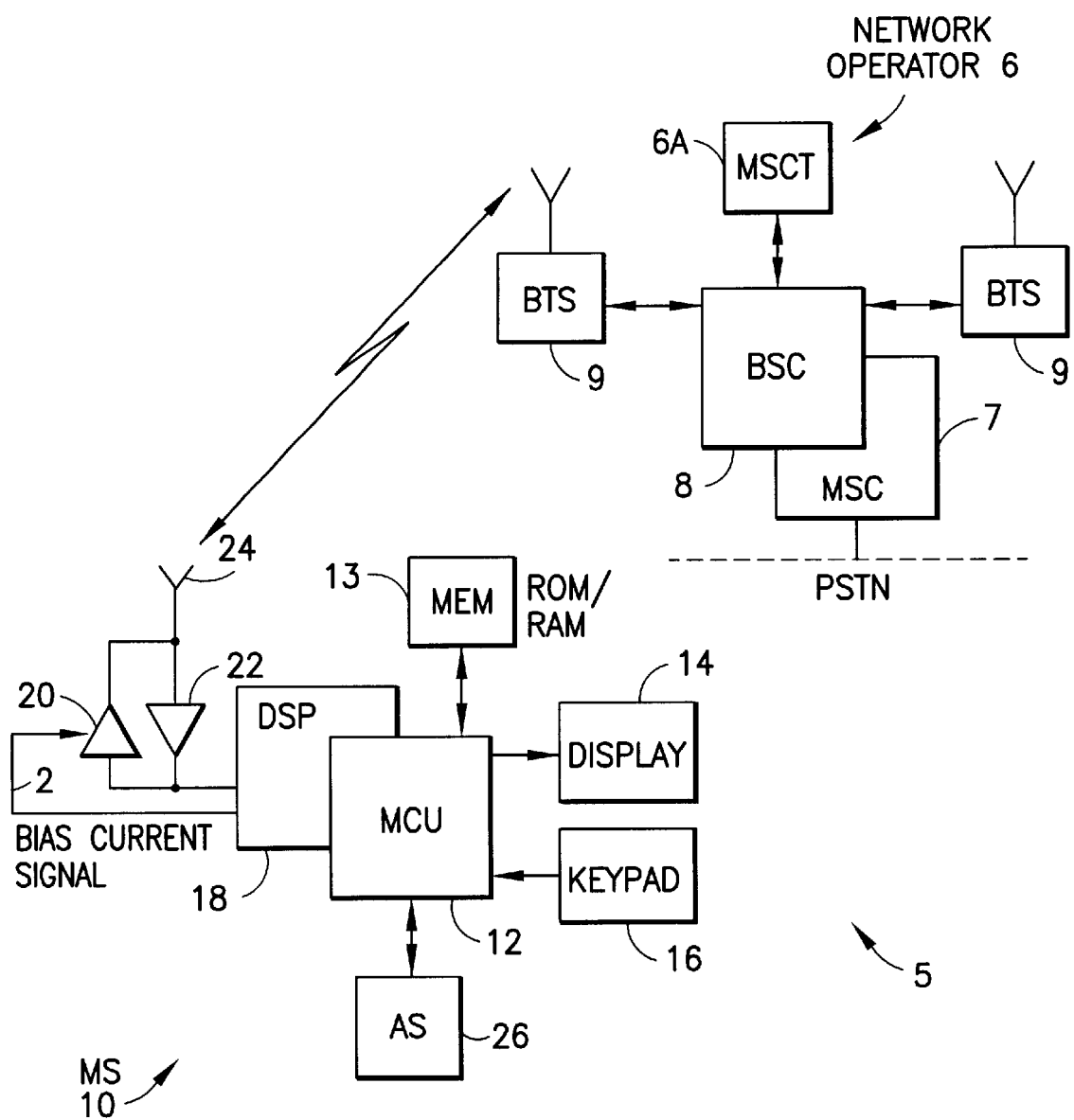
FIG. 2 is a block diagram of a wireless telecommunications system having a mobile station that includes the improved dual stage variable gain power amplifier of FIG. 3.

Before further describing these teachings, reference is first made to FIG. 2 for illustrating a simplified block diagram of an embodiment of an exemplary wireless telecommunications system 5 that includes a mobile station 10 that is constructed to include the improved dual stage transmitter power amplifier in accordance with these teachings. FIG. 2 also shows an exemplary network operator 6 having, for example, a mobile switching center (MSC) 7 for connecting to a telecommunications network, such as the Public Switched Telephone Network or PSTN, at least one base station controller (BSC) 8, and a plurality of base transceiver stations (BTS) 9 that transmit in a forward or downlink direction both physical and logical channels to the mobile station 10 in accordance with a predetermined air interface standard. A reverse or uplink communication path exists from the mobile station 10 to the network operator 6, and conveys mobile station originated access requests and traffic, such as voice and possibly packet data traffic.

The air interface standard may conform to, for example, a Time Division Multiple Access (TDMA) air interface, or to a Code Division Multiple Access (CDMA) air interface, or to a Frequency Division Multiple Access (FDMA) air interface.

The network operator 6 can include a Message Service Center (MSCT) 6A that receives and forwards messages for the mobile station 10, such as Short Message Service (SMS) messages, or any wireless messaging technique including e-mail and Supplementary Data Services.

The mobile station 10 typically includes a microcontrol unit (MCU) 12 having an output coupled to an input of a display 14 and an input coupled to an output of a keyboard or keypad 16. The mobile station 10 may be considered to be a handheld radiotelephone, such as a cellular telephone or a personal communicator, and may have a microphone and a speaker (not shown) for conducting voice communications. The mobile station 10 could also be contained within a card or module that is connected during use to another device. For example, the mobile station 10 could be contained within a PCMCIA or similar type of card or module that is installed during use within a portable data processor, such as a laptop or notebook computer, or even a computer that is wearable by the user.

The MCU 12 is assumed to include or be coupled to some type of a memory 13, including a read-only memory (ROM) for storing an operating program, as well as a random access memory (RAM) for temporarily storing required data, scratchpad memory, received data packets and data packets prepared for transmission, etc. A separate, removable SIM (not shown) can be provided as well, the SIM storing, for example, a preferred Public Land Mobile Network (PLMN) list and other subscriber-related information.

The mobile station 10 also contains a wireless section that includes a digital signal processor (DSP) 18, or equivalent high speed processor, as well as a wireless radio frequency (RF) transceiver comprised of a transmitter 20 and a receiver 22, both of which are coupled to an antenna 24 for communication with the network operator 6. The transmitter 20 is preferably a variable gain, multiple stage transmitter that receives the above-referenced bias control current signal 2 from the DSP 18. The magnitude of the bias control current signal 2 controls the gain and output power of the transmitter 20. In a Code Division Multiple Access (CDMA) embodiment it is typically the case that closed loop power control bits are transmitted from the network operator 6 to the MS 10. These bits are interpreted by the DSP 18, which controls the output power of the transmitter 20 accordingly. However, at low levels of the bias control current signal 2 the gain of the first stage 1A of the dual stage transmitter power amplifier 1 can collapse, as was discussed above. A typical range of the bias control current signal 2 is about 1 mA to about 4 mA, which in turn can translate into a range of some tens of milliamps at the output of the variable current mirrors 3A and 3B.

Figure 1:
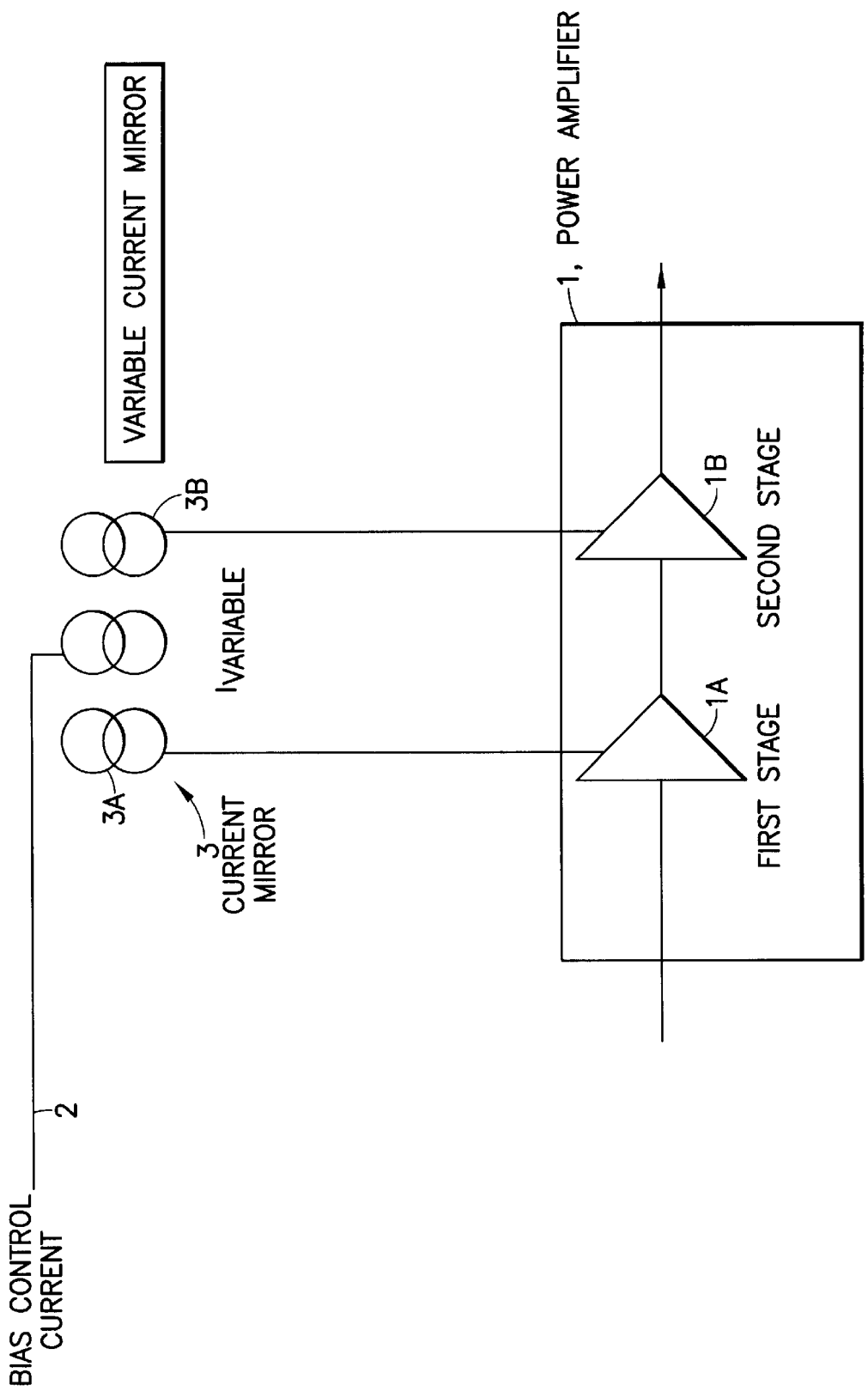
FIG. 1 is a circuit diagram of a conventional dual stage variable gain power amplifier.

The transmitter 20 is thus of most interest to these teachings, and the improvements to same in accordance with these teachings will now be described with reference to FIG. 3, wherein like components as in FIG. 1 are enumerated the same.

Figure 3:
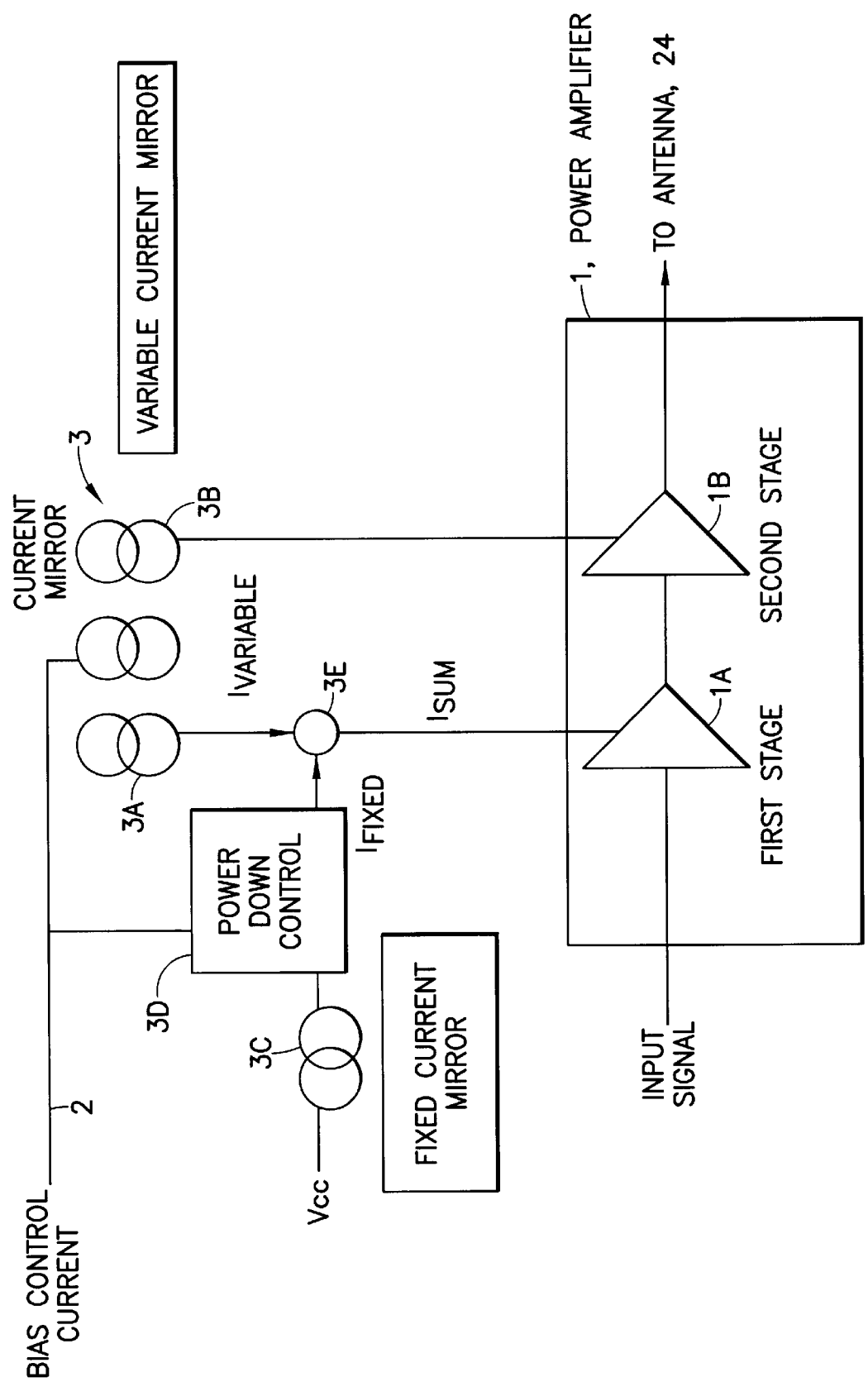
FIG. 3 is a circuit diagram of a dual stage variable gain power amplifier constructed in accordance with these teachings.

In FIG. 3 the circuitry shown in FIG. 1 is modified by the inclusion of a fixed current source, such as a current mirror 3C, that is connected in parallel with the variable current source 3A. The fixed current mirror 3C is coupled to Vcc or some other suitable voltage, and provides a constant current $I_{fixed}$, via an optional power down control block 3D, to a summing junction 3E. At the summing junction 3E $I_{fixed}$ is combined with the current output from the variable current mirror 3A, referred to as $I_{variable}$, to form a bias current $I_{sum}$. $I_{sum}$ is then applied to the first stage power amplifier 1A for controlling the gain of amplifier 1A. This beneficially extends the bias current reduction range and the gain reduction range of the power amplifier 1. That is, the use of $I_{fixed}$ sets a minimum gain threshold for the first stage power amplifier 1A, where the minimum gain threshold prevents the collapse of the gain of the first stage power amplifier 1A, thereby extending the range of the second stage amplifier 1B current and gain reduction. This overcomes the problem discussed above, where the variable gain power amplifier 1 bias current cannot be reduced below about 40 mA, as the gain of the power amplifier 1 begins to collapse rapidly below about 45 mA.

As a non-limiting example, a suitable value for $I_{fixed}$ is about 10 mA, which has been found to enable the power amplifier 1 bias current to be reduced by an additional 30 mA to approximately 15 mA. The gain reduction range of the power amplifier 1 is increased by about 5 dB to about 10 dB because of the reduction in the minimum bias current. The 30 mA bias current reduction translates to an increased talk time for the mobile station 10. In addition, the enhanced gain reduction of the power amplifier 1 has been found to improve the signal to noise ratio at low output power levels.

The optional power down control block 3D in series with $I_{fixed}$ causes the fixed current mirror 1C to be turned off when the bias control current signal goes to zero, and can be simply implemented by using a threshold detector that turns on a shunt transistor when the bias control current signal 2 drops below some minimum value. The shunt transistor then directs $I_{fixed}$ to a current sink, typically circuit ground. Disabling or turning off the fixed current mirror 3C serves to decrease the quiescent power consumption of the mobile station 10 when it is desired to turn off the transmitter 20.

While shown and described as a two stage power amplifier, those skilled in the art will realize that the power amplifier 1 may be a multi-stage amplifier containing three or more stages. In this case only the first stage may be provided with the additional baseline or minimum current $I_{fixed}$, or the first two stages could be provided with the same or differing values of $I_{fixed}$, depending on the size and power consumption of the respective amplifiers in the multi-stage power amplifier. The goal is still to prevent the gain collapse of any of the gain stages prior to the highest power amplifier stage reaching its desired minimum gain point.

Also, the construction of the current sources can be accomplished using other than current mirrors, such as by the use of constant current diodes for the fixed current source 3C and/or by other recognized techniques.

Furthermore, it should be appreciated that these teachings are not limited for use in only wireless communications devices, and that other types of devices may benefit from the application of these teachings, such as devices having a plurality of serially coupled, bias controlled variable gain stages.

Thus, while these teachings have been particularly shown and described with respect to preferred embodiments thereof, it will be understood by those skilled in the art that changes in form and details may be made therein without departing from the scope and spirit of thereof.

What is claimed is:

1. A method for operating a plurality of serially coupled power amplifiers, comprising controlling the gain of a highest powered power amplifier with a variable bias current $I_{variable}$; and simultaneously controlling the gain of a lower powered power amplifier that feeds the highest powered power amplifier with a bias current having a value equal to $I_{variable}+I_{fixed}$, where $I_{fixed}<I_{variable}$.

2. A multi-stage power amplifier, comprising a first power amplifier stage having an output coupled to an input of a second power amplifier stage, further comprising a source of variable bias current input to said second power amplifier stage for controlling the gain thereof, a source of fixed bias current, and a summing junction for summing the fixed bias current and the variable bias current for input to said first power amplifier stage for controlling the gain thereof.

3. A multi-stage power amplifier as in claim 2, and further comprising a circuit block coupled in series with the source of fixed bias current for selectively turning off the fixed bias current.

4. A mobile station comprising a transmitter and an antenna for transmitting a signal, said transmitter comprising a multi-stage power amplifier comprising a first power amplifier stage having an output coupled to an input of a second power amplifier stage, where an output of said second power amplifier stage is coupled to said antenna, further comprising a source of variable bias current that is input to said second power amplifier stage for controlling the gain thereof, a source of fixed bias current, and a summing junction for summing the fixed bias current and the variable bias current for input to said first power amplifier stage for controlling the gain thereof such that a minimum desired gain of the second power amplifier stage can be achieved without inducing a collapse in the gain of the first power amplifier stage.

5. A mobile station as in claim 4, and further comprising a circuit block coupled in series with the source of fixed bias current for selectively turning off the fixed bias current.

6. A mobile station as in claim 4, wherein the source of variable bias current is coupled to a bias control current signal that is generated by a data processor responsive to required changes in transmitter output power.

7. A method for operating a multi-stage power amplifier of a type that comprises a first power amplifier stage having an output coupled to an input of a second power amplifier stage and a source of variable bias current, comprising:

inputting the variable bias current to the second power amplifier stage for controlling the gain thereof; while operating a source of fixed bias current;

summing the fixed bias current and the variable bias current to generate a summation bias current; and inputting the summation bias current to the first power amplifier stage for controlling the gain thereof such that a minimum desired gain of the second power amplifier stage is achieved without inducing a collapse in the gain of the first power amplifier stage.

8. A method as in claim 7, and further comprising operating a circuit block that is coupled in series with the source of fixed bias current for selectively turning off the fixed bias current.

9. A method as in claim 7, and further comprising coupling an amplified output signal from the second power amplifier stage to an antenna for transmission from the antenna.

* * * * *